(12) United States Patent
Scranton et al.

(10) Patent No.: US 6,427,359 B1
(45) Date of Patent: Aug. 6, 2002

(54) SYSTEMS AND METHODS FOR PROCESSING WORKPIECES

(75) Inventors: Dana Scranton; Eric Bergman, both of Kalispell, MT (US); Eric Lund; Gil Lund, both of Kent, WA (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/907,487

(22) Filed: Jul. 16, 2001

(51) Int. Cl.$^7$ ............................. F26B 7/00; B08B 3/00
(52) U.S. Cl. ............................. 34/444; 34/279; 34/397; 34/425; 34/165; 34/166; 34/340; 34/342; 34/401; 134/902
(58) Field of Search ..................... 34/444, 279, 288, 34/397, 423, 425, 499, 505, 593, 164, 165, 166, 595, 340, 342, 401; 134/902, 200, 148, 182, 102.1, 34, 1, 1.3, 37; 118/64; 432/162; 222/364; 414/935–941; 65/271; 62/63

(56) References Cited

U.S. PATENT DOCUMENTS

| | | | | |
|---|---|---|---|---|
| 3,004,754 A | * | 10/1961 | Walpole et al. ................. 263/7 |
| 3,858,551 A | * | 1/1975 | Kobayasi ..................... 118/64 |
| 3,943,637 A | * | 3/1976 | Hanser ........................ 34/56 |
| 4,318,749 A | * | 3/1982 | Mayer ....................... 134/25.4 |
| 4,596,636 A | * | 6/1986 | Lucas ........................ 204/58.5 |
| 4,813,154 A | * | 3/1989 | Ronning ...................... 34/25 |
| 5,057,171 A | * | 10/1991 | Horner et al. ................. 156/89 |
| 5,074,057 A | * | 12/1991 | Kanai ......................... 34/179 |
| 5,230,163 A | * | 7/1993 | Lease ......................... 34/57 A |
| 5,271,165 A | * | 12/1993 | Nguyen ....................... 34/164 |
| 5,287,633 A | * | 2/1994 | Sachs ......................... 34/13 |
| 5,513,446 A | * | 5/1996 | Neubauer et al. ............. 34/397 |
| 5,660,517 A | * | 8/1997 | Thompson et al. ......... 414/217 |
| 5,664,337 A | * | 9/1997 | Davis et al. .................. 34/58 |
| 5,740,617 A | * | 4/1998 | Rittenhouse ................. 34/381 |
| 6,076,279 A | * | 6/2000 | Saalasti ....................... 34/397 |
| 6,203,582 B1 | * | 3/2001 | Berner et al. ............. 29/25.01 |
| 6,227,212 B1 | * | 5/2001 | Konishi et al. ............. 134/1.3 |
| 6,346,126 B1 | * | 2/2002 | Chao et al. .................. 8/149.2 |

* cited by examiner

Primary Examiner—Ira S. Lazarus
Assistant Examiner—K. B. Rinehart
(74) Attorney, Agent, or Firm—Lyon & Lyon LLP

(57) ABSTRACT

Workpieces requiring low levels of contamination, such as semiconductor wafers, are loaded into a workpiece support or holder within a process chamber. The process chamber has a drain opening, slot or edge. The chamber is closed via a door. A process or rinsing liquid is introduced into the chamber. The liquid rises to a level so that the workpieces are immersed in the liquid. The chamber slowly pivots or rotates to move the drain opening down to the level of the liquid. The liquid drains out through the drain opening. The drain opening is kept near the surface of the liquid to drain off liquid at a uniform rate. An organic solvent vapor is introduced above the liquid to reduce or prevent droplets of liquid from remaining on the workpieces as the liquid drains off. An outer chamber may be provided around the process chamber to provide increased control of the process environment.

26 Claims, 15 Drawing Sheets

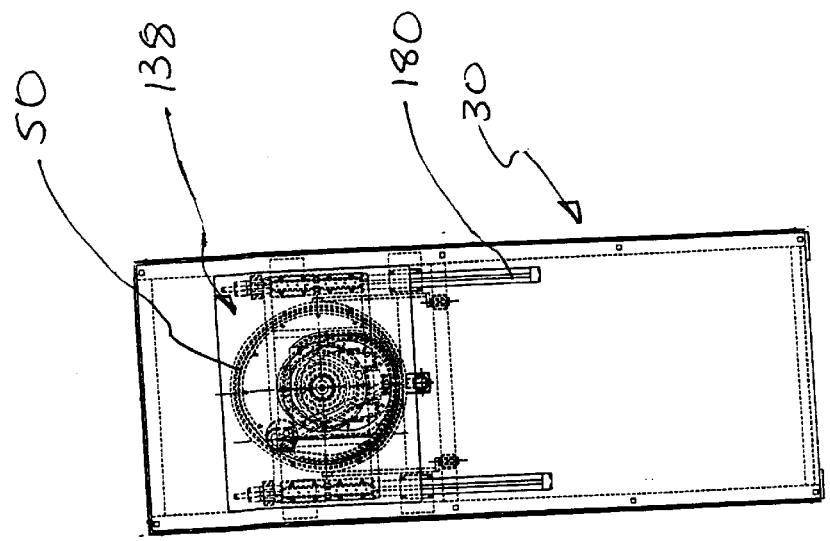
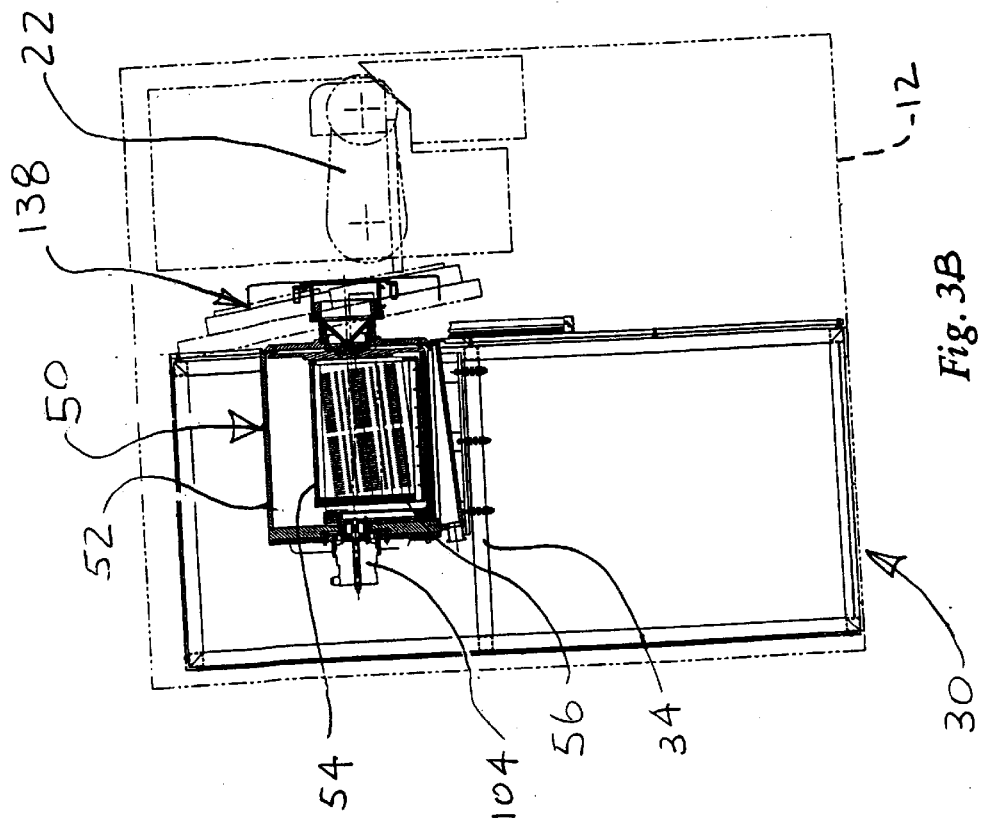

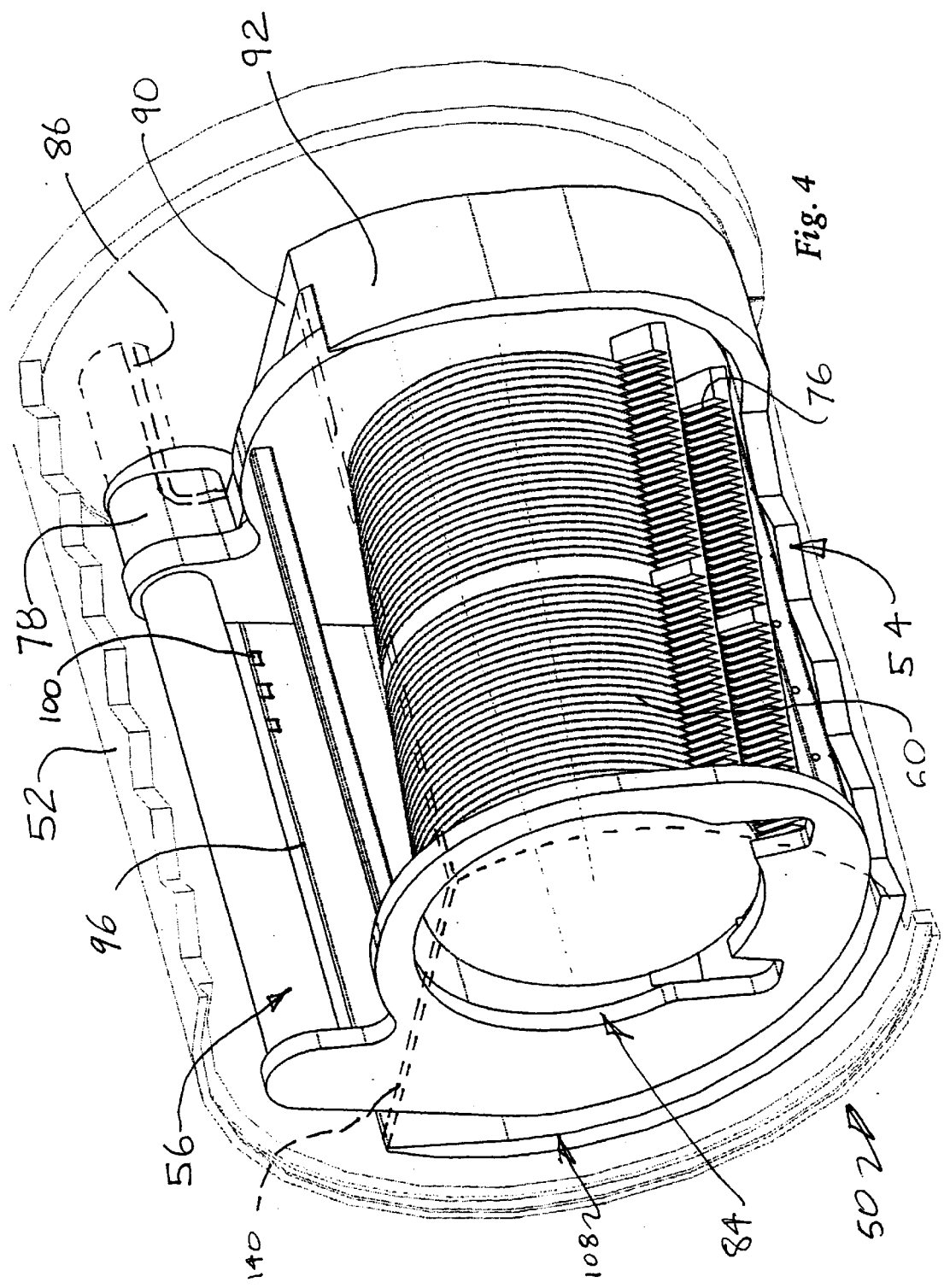

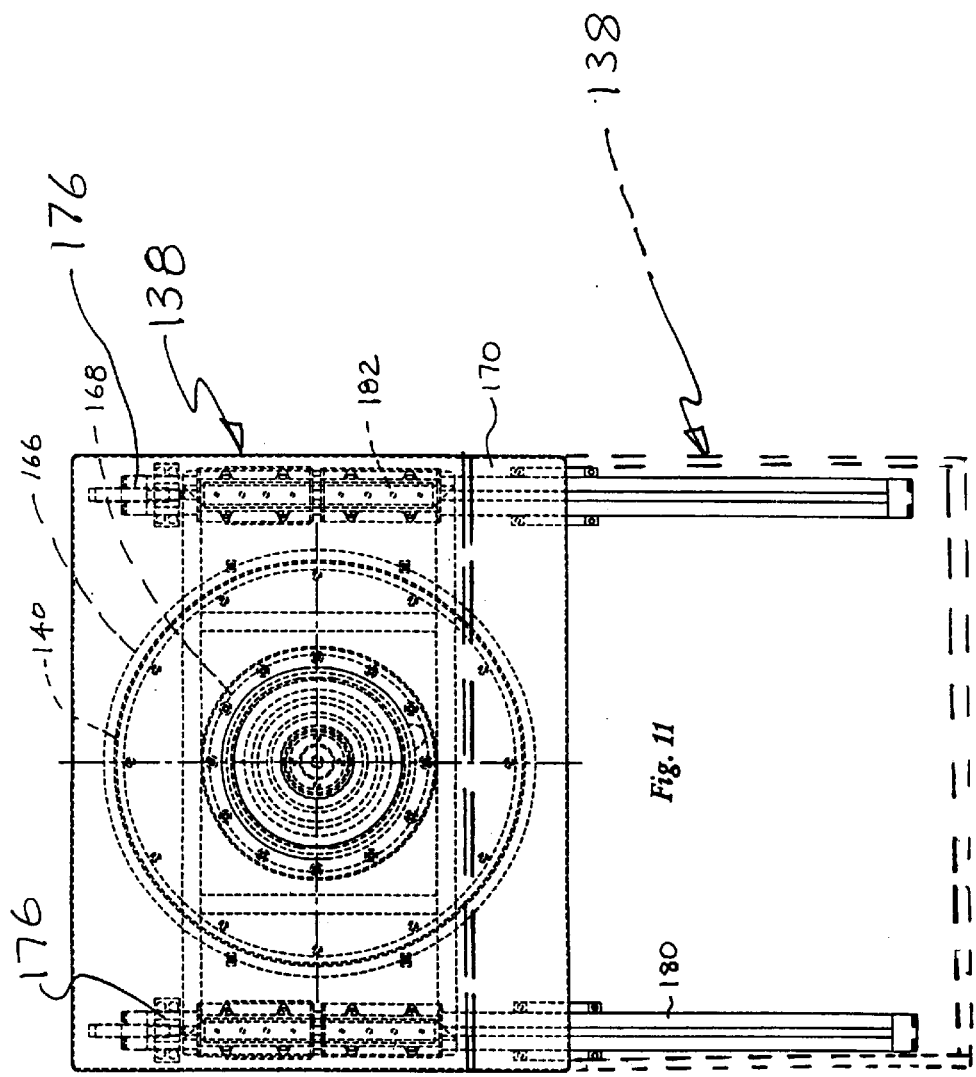
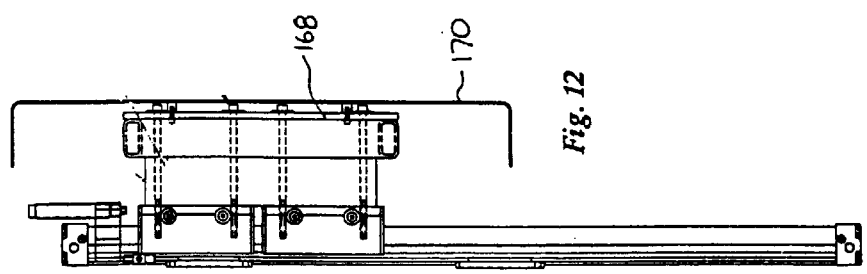

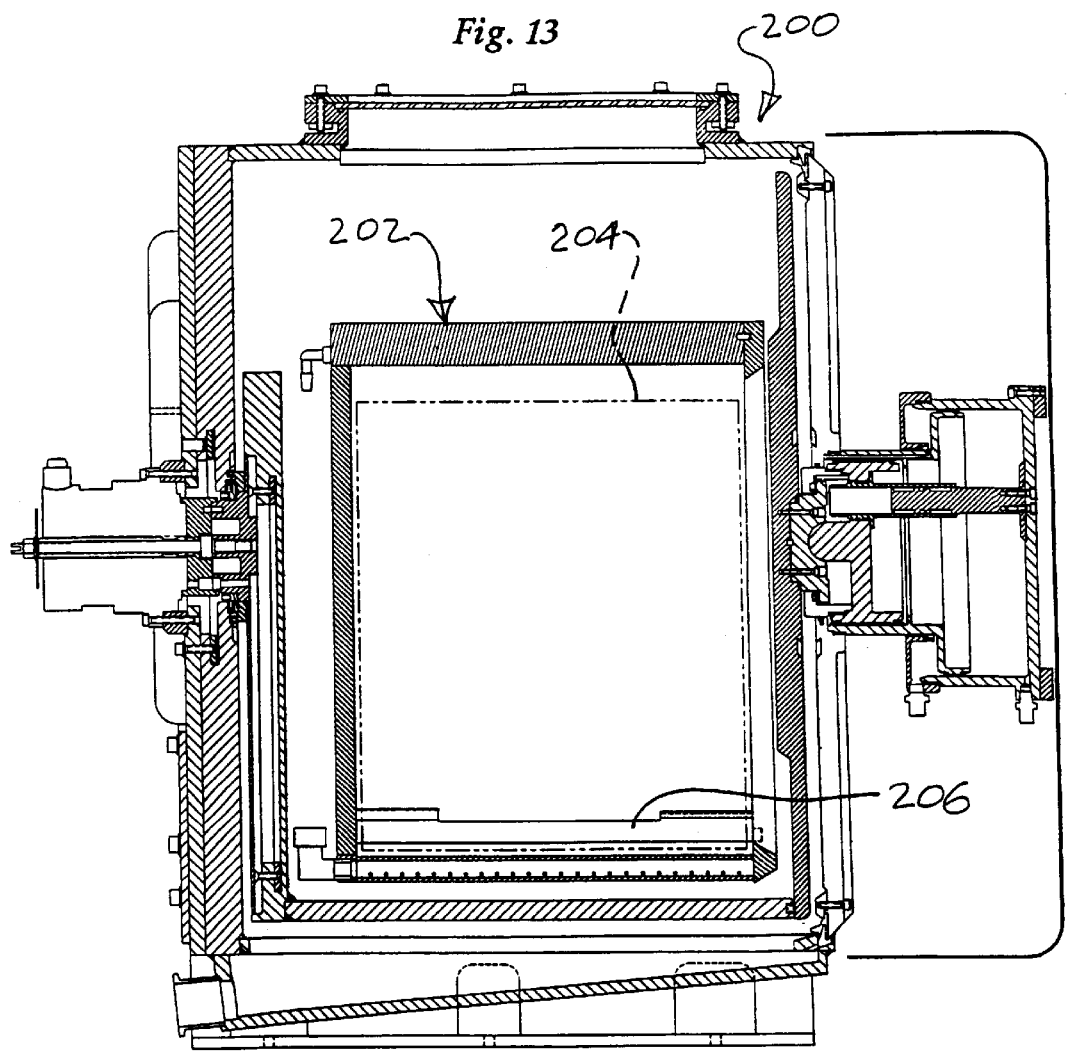

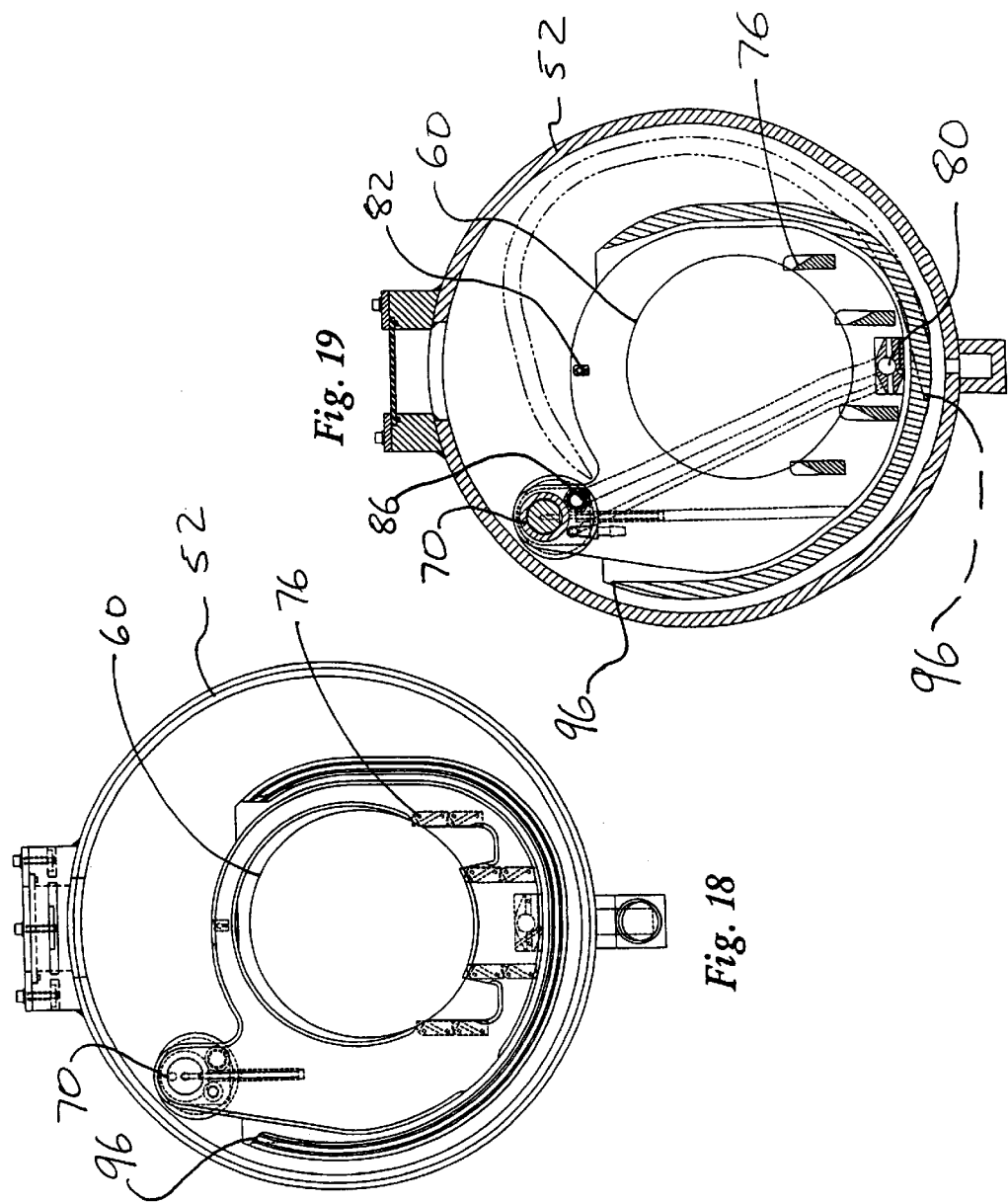

SYSTEMS AND METHODS FOR PROCESSING WORKPIECES

FIELD OF INVENTION

The invention relates to surface preparation, processing and cleaning, of workpieces, such as semiconductor wafers, flat panel displays, rigid disk or optical media, thin film heads, or other workpieces formed from a substrate on which microelectronic circuits, data storage elements or layers, or micro-mechanical elements may be formed. These and similar articles are collectively referred to here as a "workpiece".

BACKGROUND OF THE INVENTION

Surface preparation, such as cleaning, etching, and stripping, is an essential and important element of the manufacturing process for semiconductor wafers and similar workpieces. Surface preparation steps are commonly performed, using liquid corrosive, caustic, or solvent chemicals, or using vapor phase chemicals. Surface preparation of workpieces is performed to prepare or condition the surface for a subsequent process step.

Cleaning is a critical step in manufacturing semiconductors and similar products. Cleaning involves the use of chemical formulations to remove contaminants, such as oxides, particles, metals, or organic material, while maintaining the cleanliness and integrity of the surface of the workpiece. Some liquid, gas or vapor phase chemicals when applied to a workpiece, result in surface characteristics that are more susceptible to contamination than others. For example, application of hydrofluoric acid (HF) to the surface of a workpiece will remove oxide from the silicon surface, resulting in a surface that is active. Workpieces in general, and especially workpieces having an active surface, are constantly susceptible to contamination by airborne microscopic particles. Contamination can also occur in the cleaning process, when the liquid process media is removed from the surface of the workpiece.

Thus, to m contamination of the workpiece, it is advantageous to perform a sequence of surface preparation steps within a controlled environment, that preferably occupies a relatively small amount of fabrication facility space, and in which exposure to contamination sources is Cleaning workpieces while avoiding or minimizing contamination has long been an engineering challenge. Workpieces are often cleaned with a spray or bath of de-ionized water. The water is then removed, often in the presence of an organic solvent vapor, such as isopropyl alcohol, which lowers the surface tension of the water. This helps to prevent droplets of water from remaining on and contaminating the workpiece.

Various cleaning methods and systems and various rinsing and drying methods and apparatus have been proposed and used. In a typical system, wafers are immersed in a vessel. A mechanism is provided to hold the wafers. Another mechanism is provided to lift the wafers out of the liquid, by pushing them up from below. While this technique has been used, it can result in trapping of liquid in or around the spaces where the wafers contact the holding mechanism, resulting in increased contamination. In an alternative system, the wafers are held in a fixed position while the liquid is drained away from below. This technique has less tendency for trapping liquid. However, as the liquid level drops, the solvent vapor above the liquid is absorbed by the liquid. Consequently, the top sections of the wafer are exposed to liquid which is different from the liquid at the bottom sections of the wafers. This potentially results in non-uniform processing. Accordingly, while these and other techniques have been used with varying degrees of success, there is still a great need for improved systems and methods for cleaning workpieces.

SUMMARY OF THE INVENTION

To these ends, in a first aspect, surface preparation processes on a workpiece are performed within a single chamber. The workpieces are contacted by process fluids by spraying or immersion. The workpieces may be processed and/or rinsed and dried within the single chamber. This minimizes exposure of the workpiece to contaminants and provides an improved application of process fluids or media to the workpiece.

In a second aspect, workpieces are held stationery in a fixed support. A process chamber around the fixed support can pivot to move a drain outlet or edge down to the level of the liquid contained in the chamber. The liquid then drains out of the chamber over the edge or through the outlet. The process chamber provides for containment of process fluid. An optional second or outer containment chamber provides for containment and disposal of process fluid, and for isolating the process environment from the ambient environment, human operators, and adjacent parts and equipment.

In a third aspect, openings or spray nozzles on or in the process chamber, or on the fixed support, supply a fluid onto the workpieces. This allows for versatile processing.

In a fourth aspect, sonic energy, such as ultrasonic or megasonic energy, is applied to the workpiece, preferably through liquid in which the workpiece is immersed. Use of sonic energy can provide for faster and more effective processing.

In a fifth aspect, an outer chamber is provided around the process chamber. The outer chamber may be purged with a gas and/or vapor to maintain a desired environment around the workpieces.

In a sixth aspect, unique methods and apparatus are provided for cleaning a workpiece such as a semiconductor wafer. These methods and apparatus help to solve the problems of the apparatus and methods now used in the semiconductor manufacturing industry. Workpieces are held in a fixed support within a process chamber having a drain outlet. The workpieces are immersed in liquid within the process chamber by filling the chamber with liquid, preferably from one or more outlets near the bottom of the chamber. Liquid is preferably continuously supplied into the chamber so that liquid is continuously overflowing and running out of the drain outlet. The process chamber is pivoted to move the drain outlet down in a controlled movement, to lower the level of liquid in the chamber. Liquid supply to the chamber and overflow at the liquid surface preferably continues as the chamber pivots and the liquid level drops. This process continues until the liquid level drops below the workpieces and the chamber is pivoted to drain virtually all liquid out of the chamber.

By maintaining the overflow at the liquid surface, and by maintaining a constant flow towards and out of the drain outlet, impurities at the liquid surface flow away from the workpieces, reducing potential for contamination. The liquid in the chamber remains uniform at all depths, as the surface of the liquid which the solvent vapor dissolves into, is constantly being replaced with fresh liquid. Consequently, improved cleaning is provided with a uniform liquid bath. Disadvantages associated with the machines and methods currently in use, as described above, are reduced.

The aspects of the invention described above provide greatly improved processing and cleaning apparatus and methods. These aspects help to provide more reliable and efficient processing.

Further embodiments and modifications, variations and enhancements of the invention will become apparent. The invention resides as well in subcombinations of the features shown and described.

BRIEF DESCRIPTION OF THE DRAWINGS

In the drawings, wherein the same reference number indicates the same element, throughout the several views:

FIG. 3B is a side view of the process station shown in FIG. 2.

FIG. 3C is a front view of the process station shown in FIG. 3B.

FIG. 4 is a perspective view, in part section, of a processor unit shown in FIG. 2.

FIG. 11 is a front view of the door assembly shown in FIG. 10.

FIG. 12 is a side view thereof.

FIG. 13 is a section view of an alternative embodiment for processing workpieces supported within a carrier, cassette or tray.

FIG. 18 is a front section view of the processor unit shown in FIG. 14.

FIG. 19 is another section view thereof, with the process chamber shown in the 0° position in solid lines, and with the process chamber shown in the fully rotated position of FIG. 17, in dotted lines.

DETAILED DESCRIPTION OF THE DRAWINGS

A workpiece support holds workpieces, either directly, or by holding a carrier containing workpieces. A sub-chamber or process chamber is provided around the carrier support and is adapted, when closed, to hold a liquid. Liquid is provided into the process chamber, so that the workpieces are at least partially immersed. The process chamber pivots or rotates, causing a slot, drain opening or overflow edge to move down to the level of the liquid. This allows liquid to move out of the process chamber. The process chamber continues to rotate until most or all liquid is removed from the chamber. Other steps and features described below may be advantageous, but are not necessarily essential to the invention.

Figure 1:
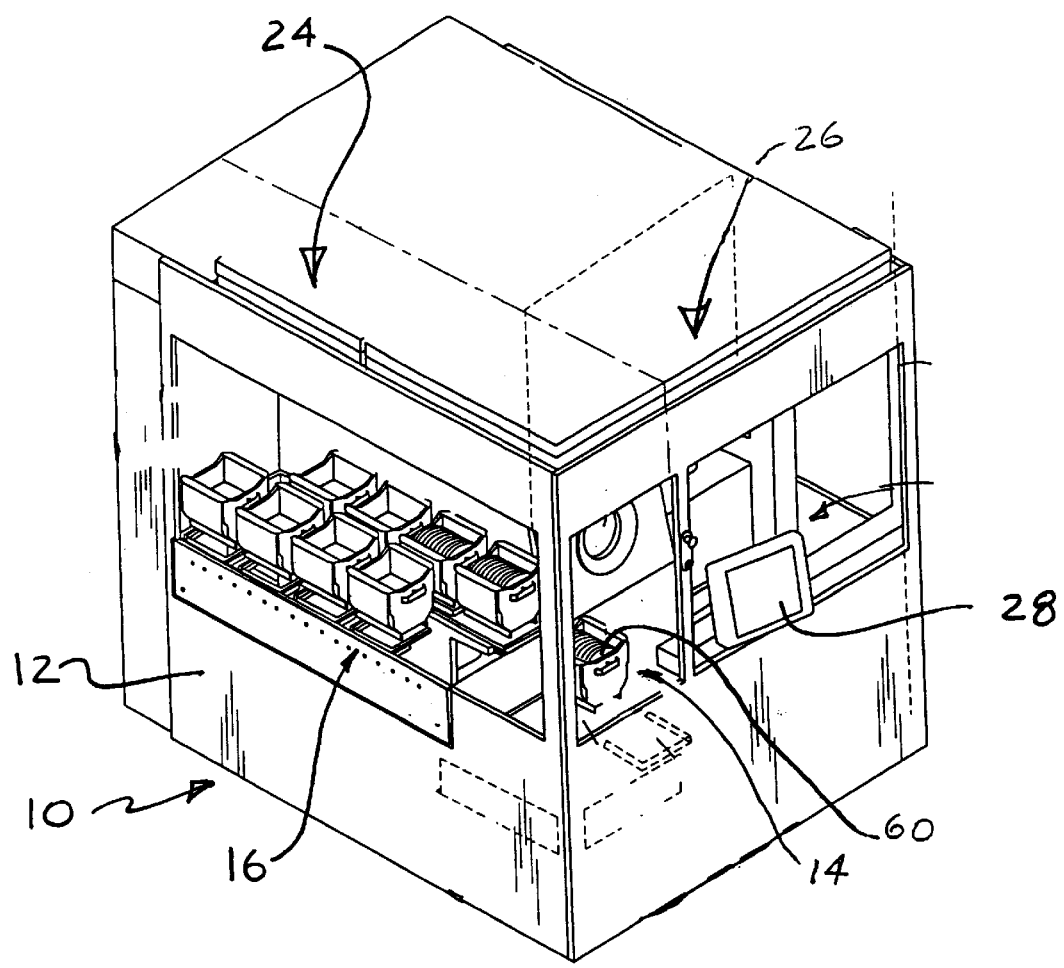
FIG. 1 is a perspective view of a system for processing workpieces.
Figure 2:
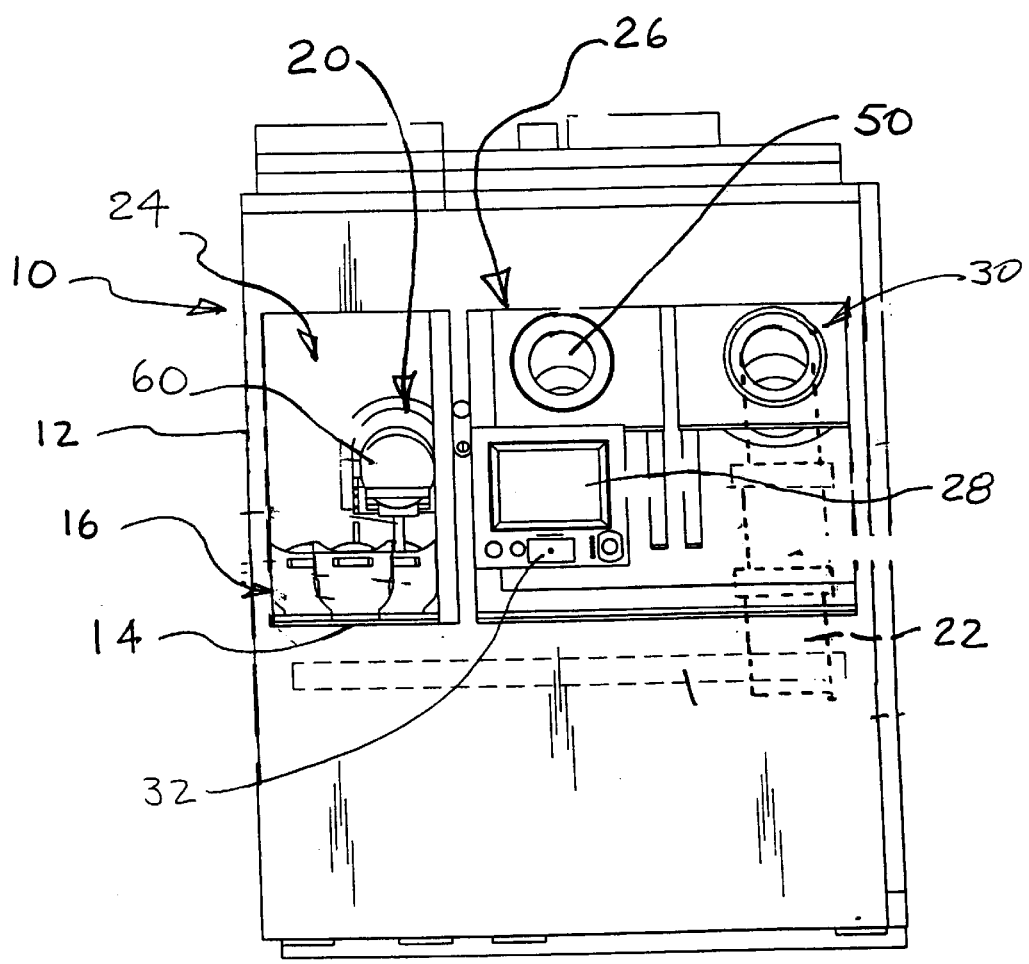
FIG. 2 is a front view of the system shown in FIG. 1.
Figure 3A:
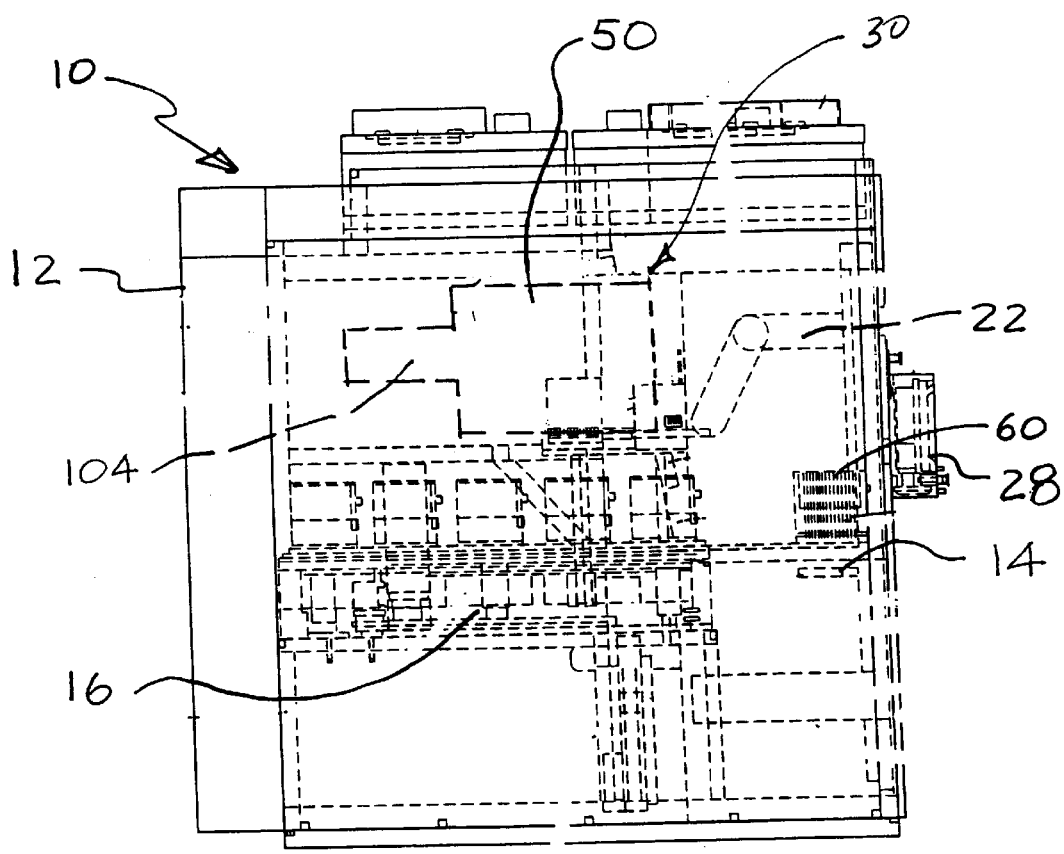
FIG. 3A is a side view of the system shown in FIG. 1.

As shown in FIGS. 1, 2 and 3A, a workpiece processing system 10 preferably has an enclosure 12 to maintain and control clean air flow and reduce contamination of workpieces. An input/output station 14 at the front of the system 10 allows workpieces 60 to be loaded and unloaded from the system 10. An indexer 16, or other temporary workpiece storage is provided adjacent to the input/output station 14.

The system 10 is preferably divided into an interface section 24 and a process section 26. These sections may be separated by a partition having a door opening. The interface section 24 includes the input/output station 14 and the indexer 16 or other temporary workpiece storage. The process section 26 includes one or more process stations 30, with each process station 30 including a processor unit 50. The process station is separately shown in FIGS. 3B and 3C. The interface section 24 also includes a process robot 22 for moving workpieces to and from the indexer 16 and processor unit 50. A control panel 28 may be provided on the enclosure 12, to allow instructions or programming to be input into a computer controller 32 which controls the system 10.

The workpieces 60 may be provided in open carriers, cassettes or trays, and handled as described in U.S. patent application Ser. No. 09/274,511, incorporated herein by reference. Alternatively, the workpieces 60 may be provided within sealed pods or containers which are unsealed at a docking station, as described in U.S. patent application Ser. No. 08/994,737 or 09/612,009, both incorporated herein by reference.

A processor unit 50 is shown in FIG. 4. The processor unit 50 may be used in the automated system 10, shown in FIGS. 1–3A, 3B and 3C or in other automated systems, or it may be used alone, with workpieces loaded and unloaded from the processor unit 50 manually, or via a dedicated robot. As shown in FIG. 4, the processor unit has a workpiece support 56. The workpiece support 56 is fixed in position and does not move. A process chamber or sub-chamber 54 surrounds or encloses the workpiece support 56, generally on three sides. The top of the chamber 54 is open.

Figure 6:
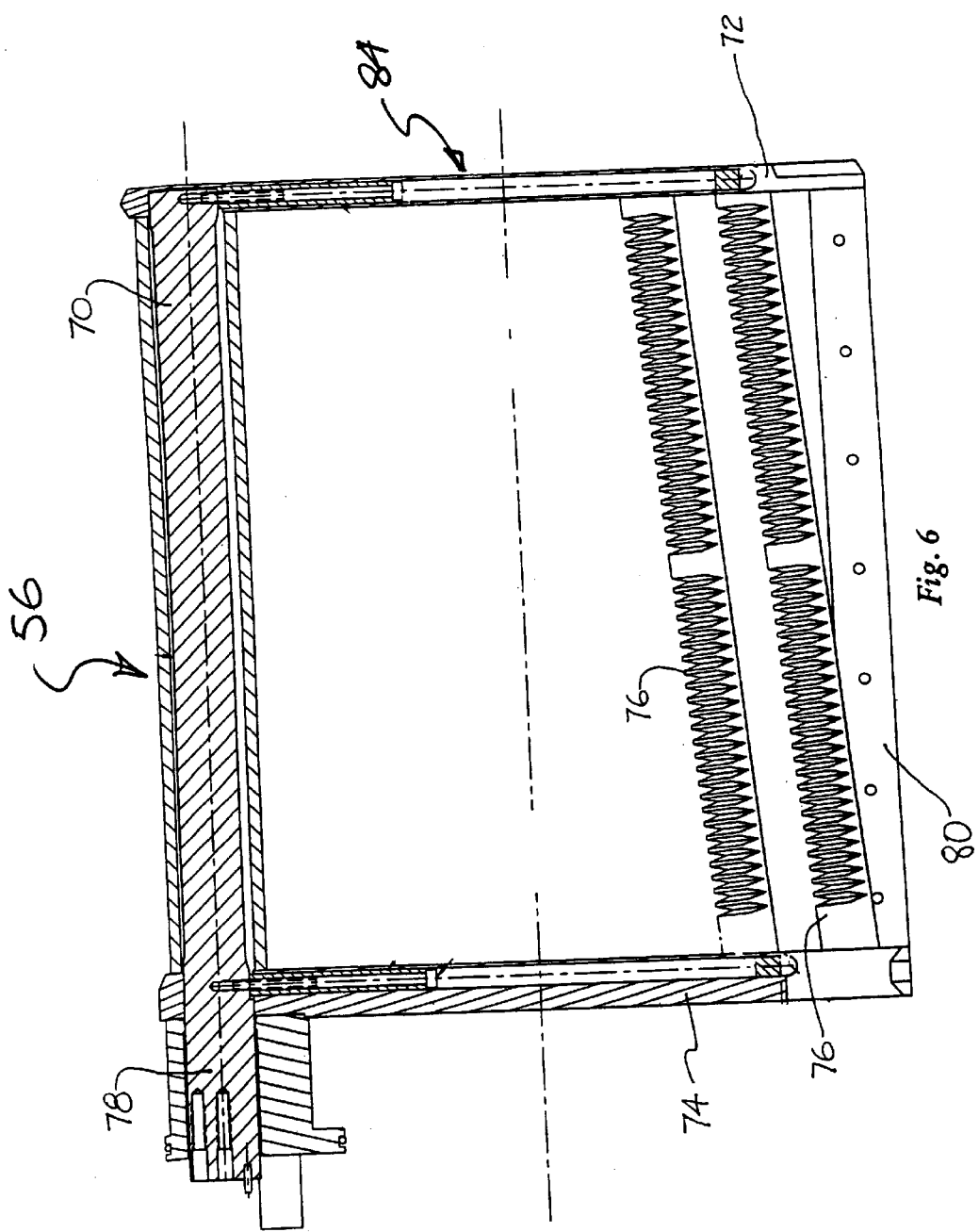
FIG. 6 is a section view of the workpiece support shown in FIGS. 4 and 5.

The workpiece support 56 is shown as a separate component or subassembly, in FIG. 6. A front ring 72 and a rear ring or plate 74 are attached to a support arm 70. Combs 76, or other workpiece edge supports (such as bars or rods) extend between the front ring 72 and the rear ring 74. An attachment hub 78 at the back end of the support arm 70 is attached to the back wall of the outer chamber 52 or other fixed structure. Consequently, the wafer support 56 is fixed in place, relative to chamber 54 and the process robot 22. A front opening 84 in the front ring 72 allows workpieces 60 to be loaded and unloaded from the workpiece support 56.

Figure 5:
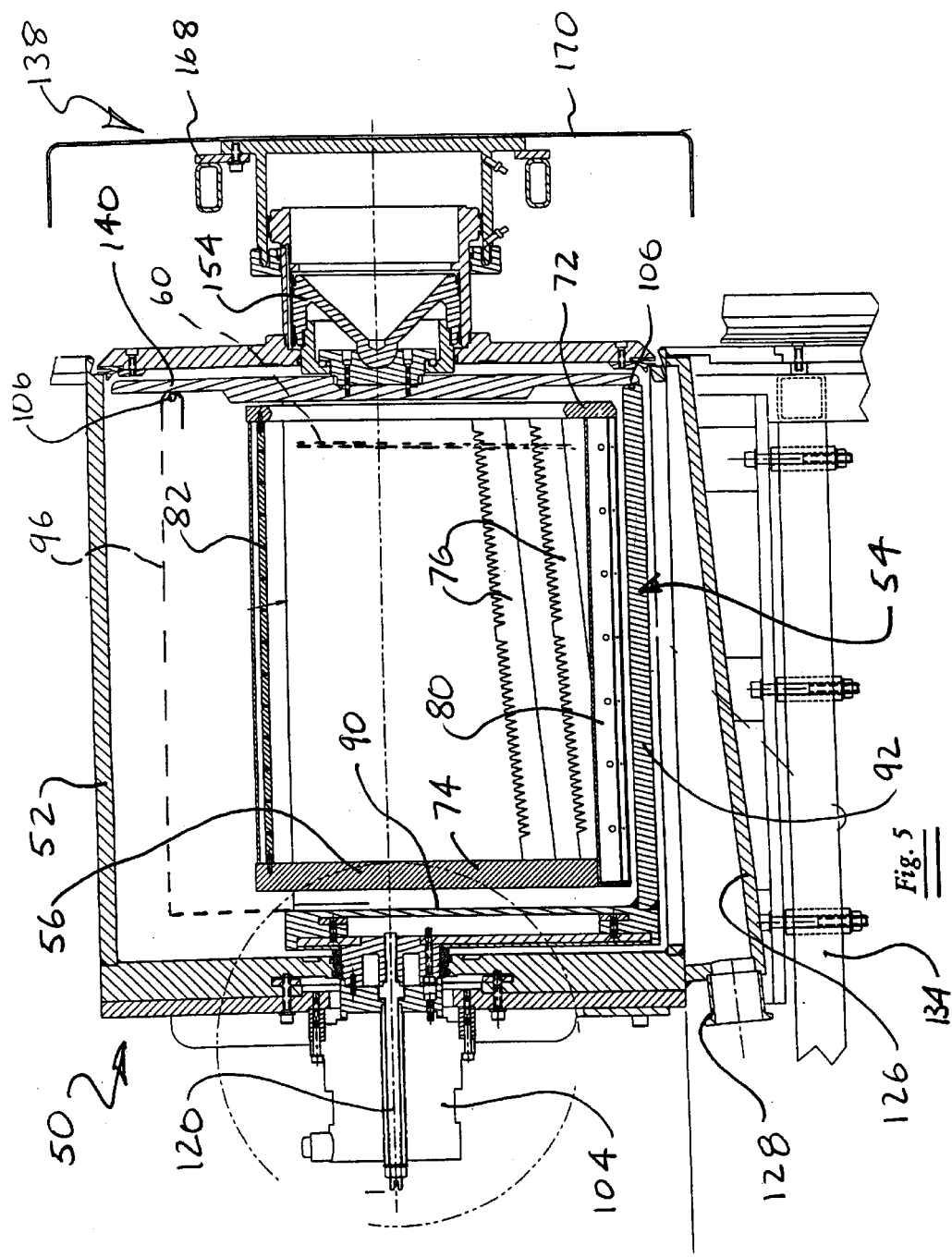
FIG. 5 is a partial section view of the processor unit shown in FIG. 4.

Referring to FIGS. 5 and 6, an upper manifold 82 is provided near the top of the workpiece support 56. The upper manifold 82 is connected to a process liquid or vapor supply, preferably isopropyl alcohol vapor (although other liquids and vapors may be used). A lower or second manifold 80 is provided near the bottom of the workpiece support 56. The lower manifold 80 is connected to a supply of process or rinse liquid, preferably, deionized water.

Figure 7:
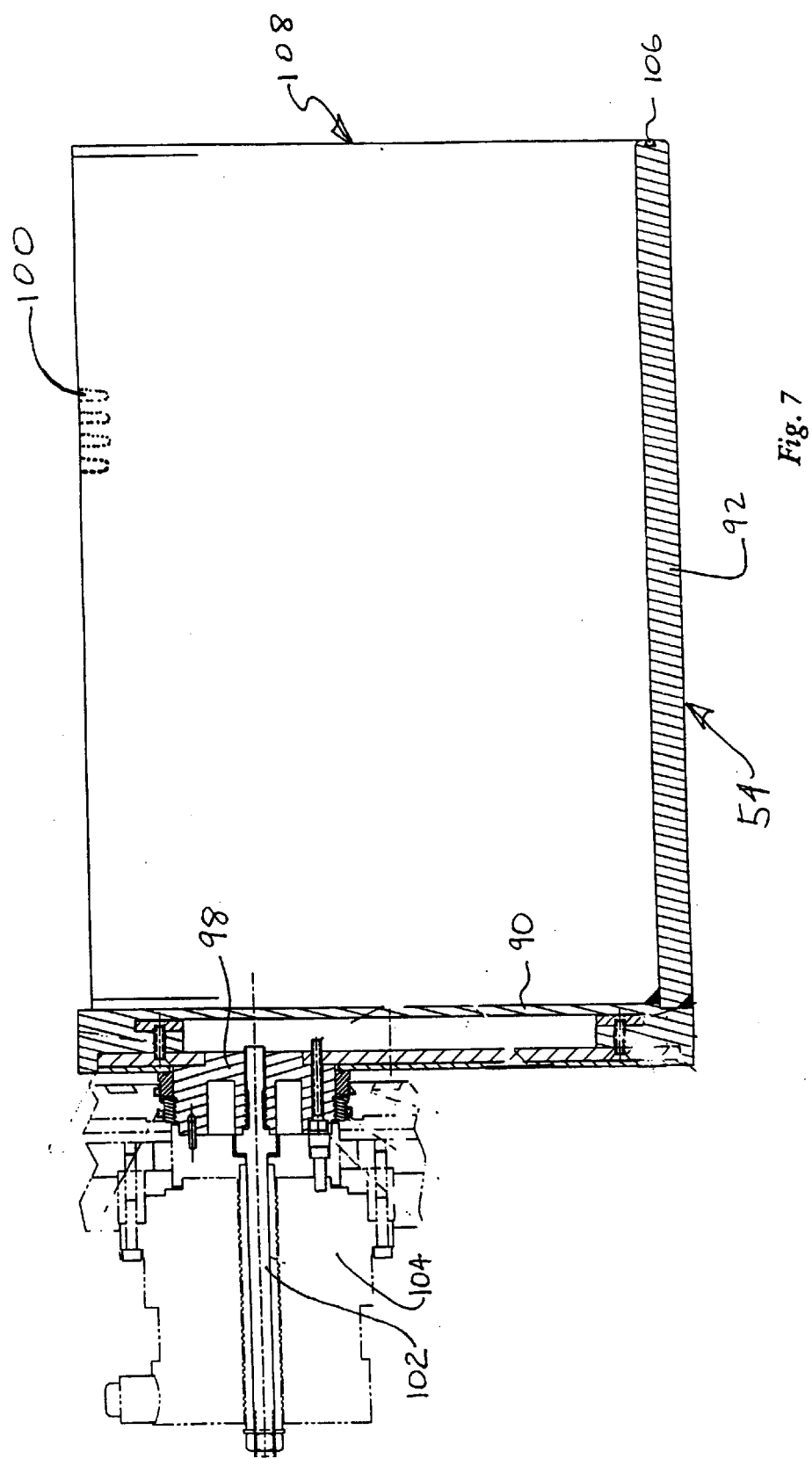
FIG. 7 is a section view of the process chamber shown in FIGS. 4 and 5.

FIG. 7 shows the chamber 54 separately. As shown in FIG. 7, the chamber 54 has a cylindrical wall 92 attached to a back wall or plate 90 at the back end of the chamber 54. As shown in FIG. 4, the cylindrical wall 92 is open at the top. One of the upper edges of the cylindrical wall 92 (at the left side in FIG. 4) forms a drain edge 96. In use, liquid contained within the chamber or bowl 54 flows out over the drain edge 96. Notches 100 may be provided in the drain edge 96 to improve liquid outflow characteristics.

The chamber 54 is attached to and supported by an axle 98 pivotably supported in the outer chamber 52 (if used) or other fixed structure of the process station 30. Referring to FIGS. 5 and 7, a drive shaft 102 of a motor or rotary actuator 104 extends through the axle 98 and is joined to the back plate 90 of the chamber 54. The motor or actuator 104 may be electrical, hydraulic, pneumatic, etc. Actuation of the motor 104 causes the chamber 54 to pivot. Where an outer chamber 52 is used, the drive shaft 102 may be replaced with a magnetic coupling, to avoid penetrating into the process environment around the workpieces.

Figures 8, 9:
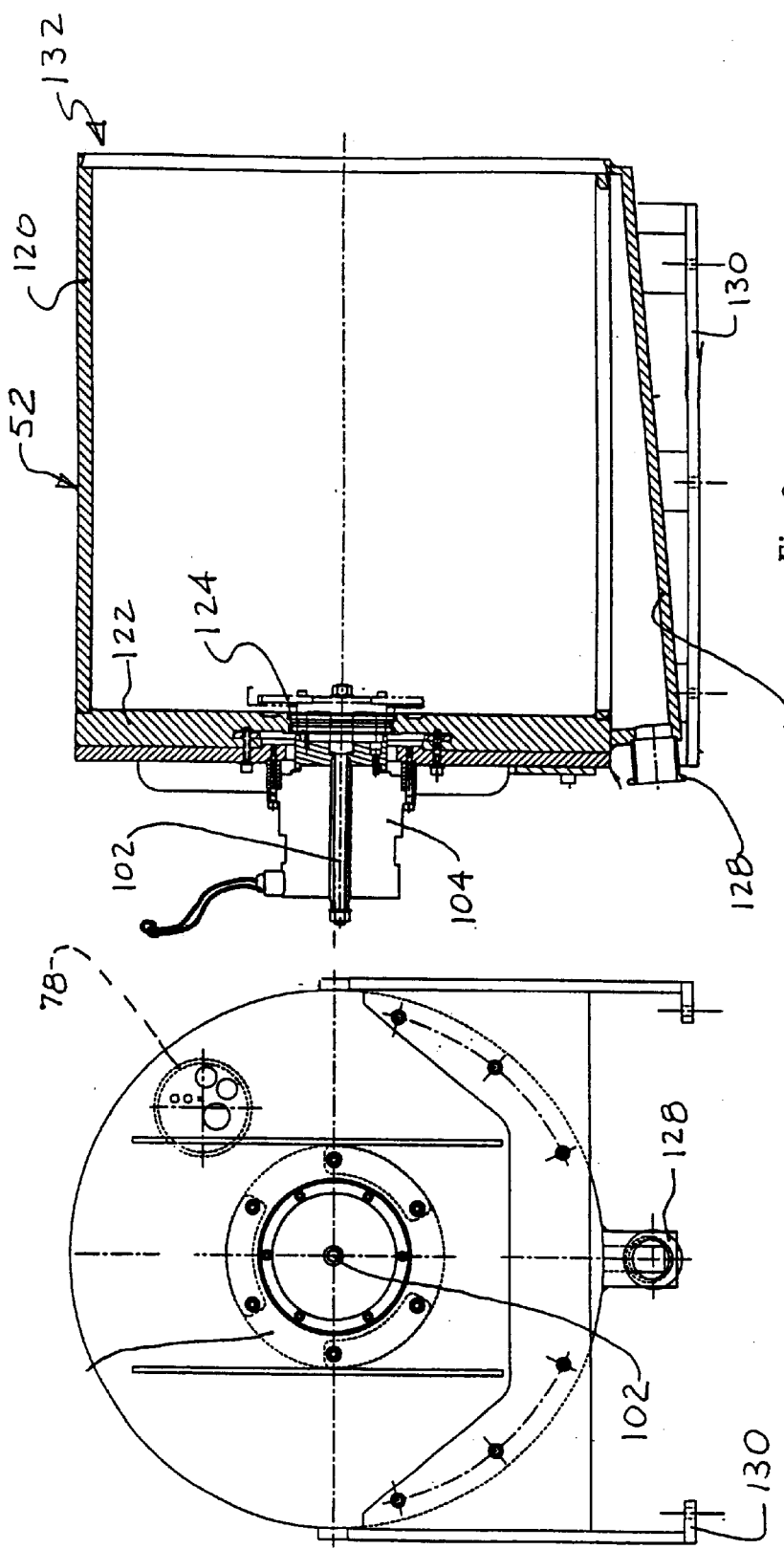
FIG. 8 is a section view of the chamber or bowl shown in FIGS. 4 and 5.
FIG. 9 is a back end view thereof.

FIGS. 8 and 9 show the optional outer chamber 52 as a separate assembly, with various components removed for purpose of illustration. Referring to FIG. 8, the outer chamber 52 includes a cylindrical wall 120 joined to a back plate 122. A drain trough 126 at the bottom of the outer chamber 52 is provided to collect liquid and direct it to a drain outlet 128. The drain outlet 128 is connected to a facility waste drain or other drain system. A base plate 130 which supports the outer chamber 52 is in turn attached to a chassis 134 shown in FIG. 5, or other structure of the process station 30. The cylindrical wall 120 of the outer chamber 52 extends continuously (360°). The front end 132 of the outer chamber 52 is open.

Referring to FIG. 5, a door assembly 138 is provided to close off the open front end or front opening 84 of the chamber 54 during processing. This allows the chamber 54 to hold liquid during processing. As also shown in FIG. 5, where an outer chamber 52 is used, the door assembly 138 also closes off the open front end 132 of the outer chamber 52.

Figure 10:
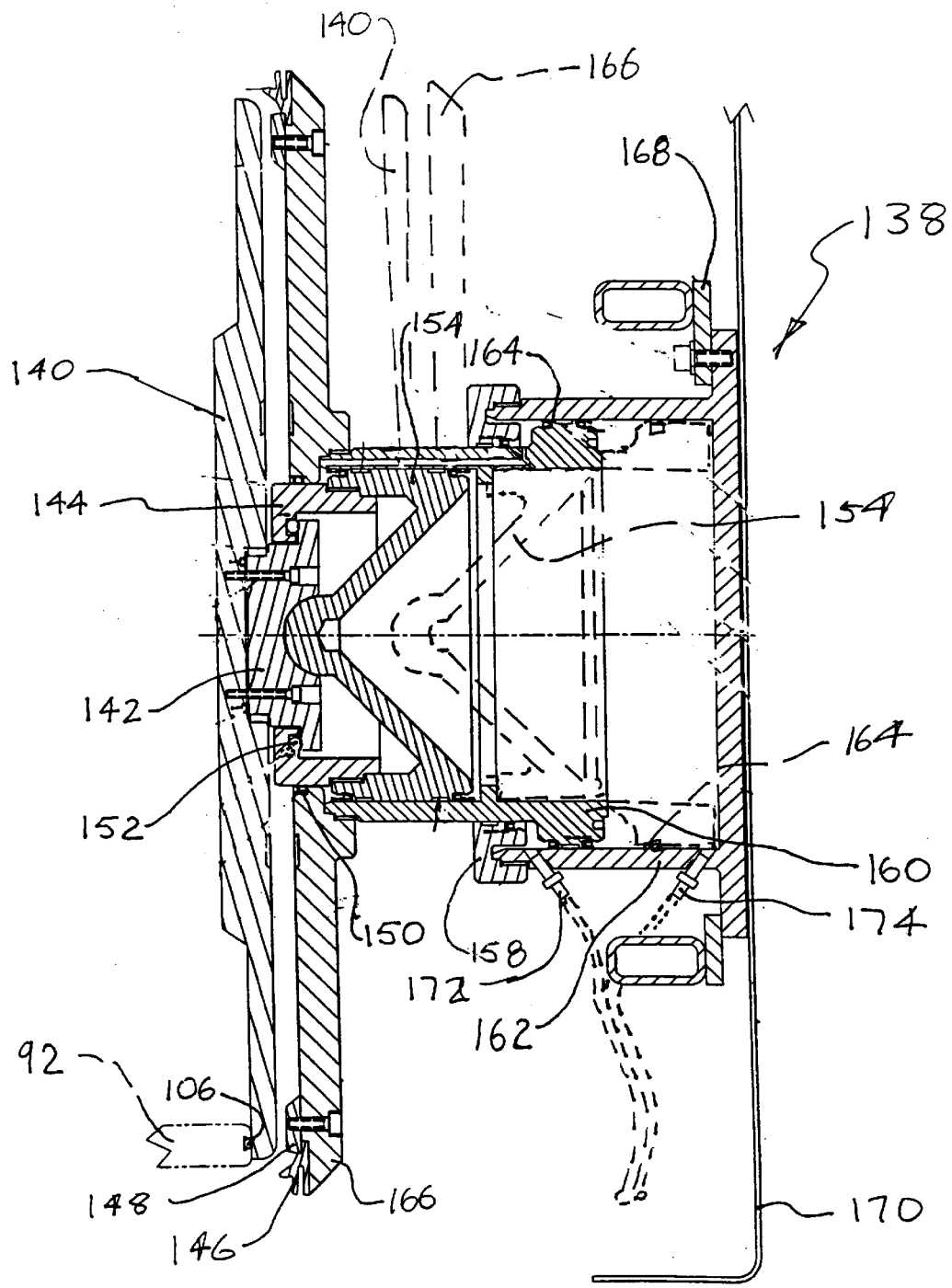
FIG. 10 is an enlarged section view of the door assembly shown in FIG. 5.

Referring to FIGS. 5 and 10, the door assembly 138 includes a chamber door plate 140 attached to a pivot socket 142. The pivot socket 142 is secured within a retainer 144 by a pivot ball 154. The door plate 140 and pivot socket 142 can pivot on an O-ring 152 relative to the retainer 144. This allows the door plate 140 to pivot with the chamber 54, while the rest of the door assembly 138 remains in place.

The pivot ball 154 is secured within an inner cylinder 160. The inner cylinder 160 is held within an outer cylinder 162. A sliding pressure seal 164 seals the inner cylinder 160 against the outer cylinder 162, while allowing the inner cylinder to slide (in the left-right direction in FIG. 10) within the outer cylinder 162. Compressed air or fluid ports 172 and 174 are provided at the outer and inner ends of the outer cylinder 162, on opposite sides of the sliding pressure seal 164. By introducing air or a liquid under pressure into the port 172 or 174, the inner cylinder 160 is moved in or out, to engage and disengage the plate 140 to the chamber 54. A cap 158 attached to the inside end of the outer cylinder 162 captures the inner cylinder 160 and limits its movement to a prescribed range. An outer chamber door plate 166 is attached to the inner cylinder 160. A seal retainer 148 holds an outer chamber door seal 146 onto the door plate 166.

Referring still to FIGS. 5 and 10, a door mounting plate 168 supports the outer cylinder 162. A cover 170 is optionally provided over the front surface of the outer cylinder 162.

Referring momentarily to FIGS. 11 and 12, the entire door assembly 138 is supported on door rails 180 joined to supporting structure of the processor unit 50 or the enclosure 12. Sleeves 182 attached to the door mounting plate 168 slide on the door rails 180. Actuators or motors 176 move the entire door assembly 138 vertically along the door rails.

In use, workpieces 60 are loaded into the system 10 at the input/output station 14. Typically, several carriers, cassettes or trays of workpieces 60 will be loaded in, so that several, or all, of the available storage positions in the indexer 16 are occupied. The indexer 16 may have shuttle positions and movements, as shown in FIGS. 1 and 3. Alternatively, fixed or moving transfer carriages may be used, as described in U.S. Pat. No. 5,660,517, incorporated herein by reference. Carousel systems may also be used, as described in U.S. Pat. No. 5,664,337 or U.S. patent application Ser. No. 08/994,737, incorporated herein by reference. The workpieces 60 may alternatively be provided into the system 10 within sealed containers or pods, as described in U.S. patent application Ser. No. 08/994,737 or Ser. No. 09/612,009, incorporated herein by reference. If the workpieces 60 are provided within sealed pods, the pods may be handled, unsealed, and accessed as described in the patent applications referenced above.

The workpieces 60 are picked up by the process robot 22, and moved from the interface section 24 to the process section 26. The movement of the workpieces 60 from the indexer 16 or other storage location within the interface section 24 may be achieved as described in Ser. Nos. 08/994,737; 09/274,511; or 09/612,009. Process parameters and workpiece movement may be controlled by the computer/controller 32, or by the control panel 28, or by another remote or facility computer/controller.

During loading and unloading, the door assembly 138 is in the down position, as shown in double dotted lines in FIG. 11. The process robot 22 moves the workpieces through the open front end 132 of the outer chamber 52 (if used), through the open front end 108 of the chamber 54, and through the open front end of the workpiece support 56. The process robot 22 places the workpieces 60 into the combs 76 or other support surface within the workpiece support 60. The process robot 22 then withdraws. The workpieces 60 are held in the workpiece support 56 so that they do not touch each other. Generally, the workpieces are in an upright or near upright position (for example, within+/−5, 10, 15, 20 or 30° of vertical). The combs 76 may hold the workpieces at a slight angle of e.g., 5–15°, to reduce workpiece movement.

The door assembly 138 moves from the down position, shown in double dotted line in FIG. 11, to the up position, as shown in solid lines in FIGS. 11 and 12.

The door assembly 138 is in the withdrawn or disengaged position, with the inner cylinder 160, pivot ball 154, door plate 166 and chamber door plate 140 shifted forward and away from the outer chamber 52 and the process chamber 54, as shown in dotted lines in FIG. 10. A pressurized liquid or gas is provided into the outer cylinder 162 by the outer port 174. This drives the inner cylinder 160 and the door plates 166 and 140 rearwardly and into engagement with the outer chamber 52 and the process chamber 54. Specifically, as the inner cylinder 160 moves inwardly towards the outer chamber 52 and the process chamber 54, the door plate seal 106 around the front edge of the cylindrical wall 92 of the chamber 54 is engaged by the chamber door plate 140. Simultaneously, the outer chamber door plate 166 moves into engagement with the seal 146 on the door plate 166 engaging the front rim of the outer chamber cylindrical wall 120.

With the door assembly 138 in the engaged position, as shown in FIG. 5, the chamber 54 can contain liquid, and be filled to a level up to the drain edge 96, so that the work pieces 60 are immersed. The contact at the seal 106 between the front end of the cylindrical wall 92 of the chamber 54, and the chamber door plate 140 may provide a liquid tight seal. However, a small amount of leakage is generally acceptable. Similarly, a small amount of leakage past the seal 146 is also generally acceptable.

With the door assembly 138 engaged, liquid is introduced into the process chamber 54. The liquid may be sprayed from nozzles or it may simply from openings in the lower manifold 80. The liquid is preferably de-ionized water. The lower manifold 80 is supplied via a liquid supply line 86 extending through the support arm 70 and attachment hub 78. This avoids interference between pivoting movement of the chamber 54 and the liquid supply line 86 connecting to the lower. manifold 80 on the work piece support 56. The combs 76 preferably provide positions for multiple work pieces, for batch processing, in a batch of, for example, 5–50 workpieces. The lower manifold 80 is preferably at or near the bottom of the workpiece support.

Figure 14:
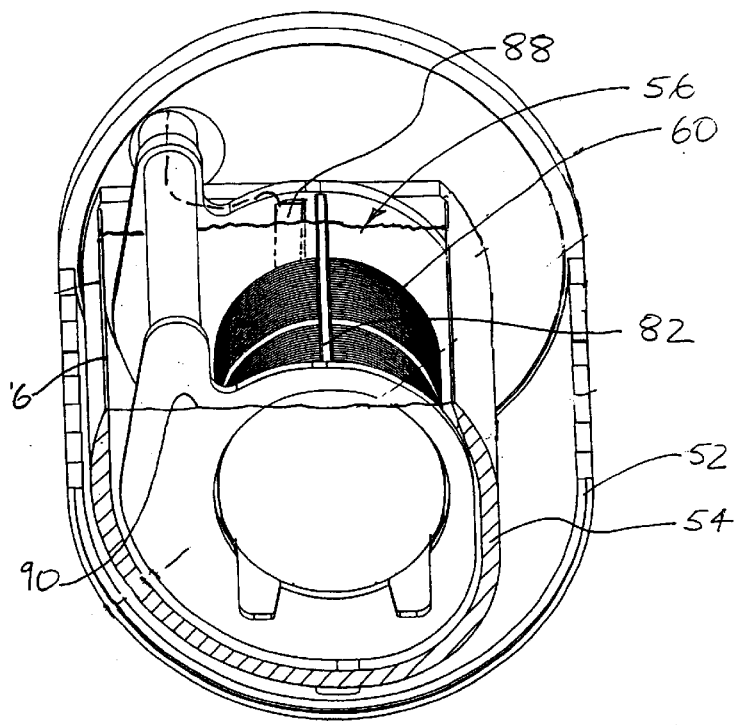
FIG. 14 is a perspective view, in part section, of the processor unit shown in FIGS. 4 or 13, with the inner process or sub-chamber in an upright or 0° position, and with various components removed for purposes of illustration.
Figure 15:
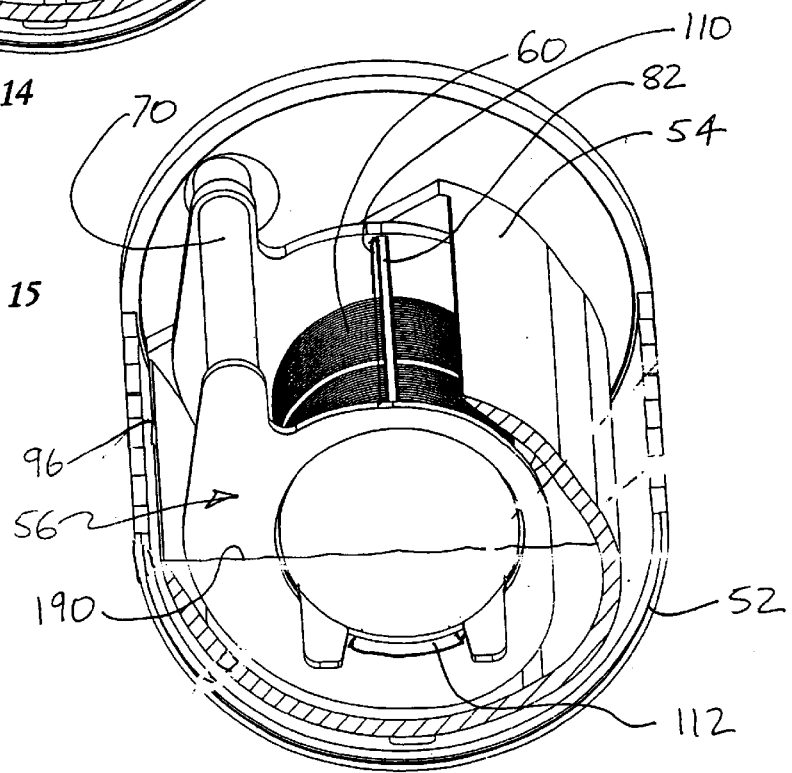
FIG. 15 is a perspective view of the processor unit shown in FIG. 14, with the process chamber now pivoted about 30°, to remove liquid.

Water or other liquid is supplied via the manifold 80 while the chamber 54 is in the upright or 0° position, as shown in FIGS. 4 and 14. Water is supplied into the chamber 54 preferably until the work pieces 60 are fully immersed, as shown in FIG. 14. Water supply is then stopped. The drain edge 96 is vertically above the top edge of the workpieces The computer/controller 32 determines when the work pieces are immersed, via a volume flow meter measuring flow through the supply line 86, or alternatively, from liquid level detectors 88 on the workpiece support 56.

Upon reaching a predetermined level, or after a predetermined delay interval, the controller 32 energizes the motor or actuator 104, to begin pivoting or turning the chamber 54. The chamber 54 then begins to pivot about the axle 98, so that the drain edge 96 moves down. As this occurs, the water 190 flows over the drain edge 96 and out of the chamber 54. If an outer chamber 52 is provided, the water is collected at the bottom of the outer chamber 54, runs into the drain trough 126, and out of the processor unit 50 via the drain outlet 128. The controller 32 and motor or actuator 104 preferably turn the chamber 54 at an angular rate which causes the level of water or liquid 190 to drop at a substantially uniform linear vertical rate. Preferably, the chamber is turned or pivoted so that the liquid drains out at a rate of about 0.1–30 or 0.1–10 or 0.1–5 or 0.1–2 mm/second, 0.5–10 or 0.5–5 or 0.5–1 or 2 mm/second. The drain or drop rate is selected to be as fast as practical, without having the meniscus separate from the workpiece surface. As the drain edge 96 moves in a circle about the axle 98 as the chamber 54 pivots, a sinusoidal pivot speed profile of the chamber 54 provides a constant or linear decrease in the liquid level 190 within the chamber 54.

Figures 16, 17:
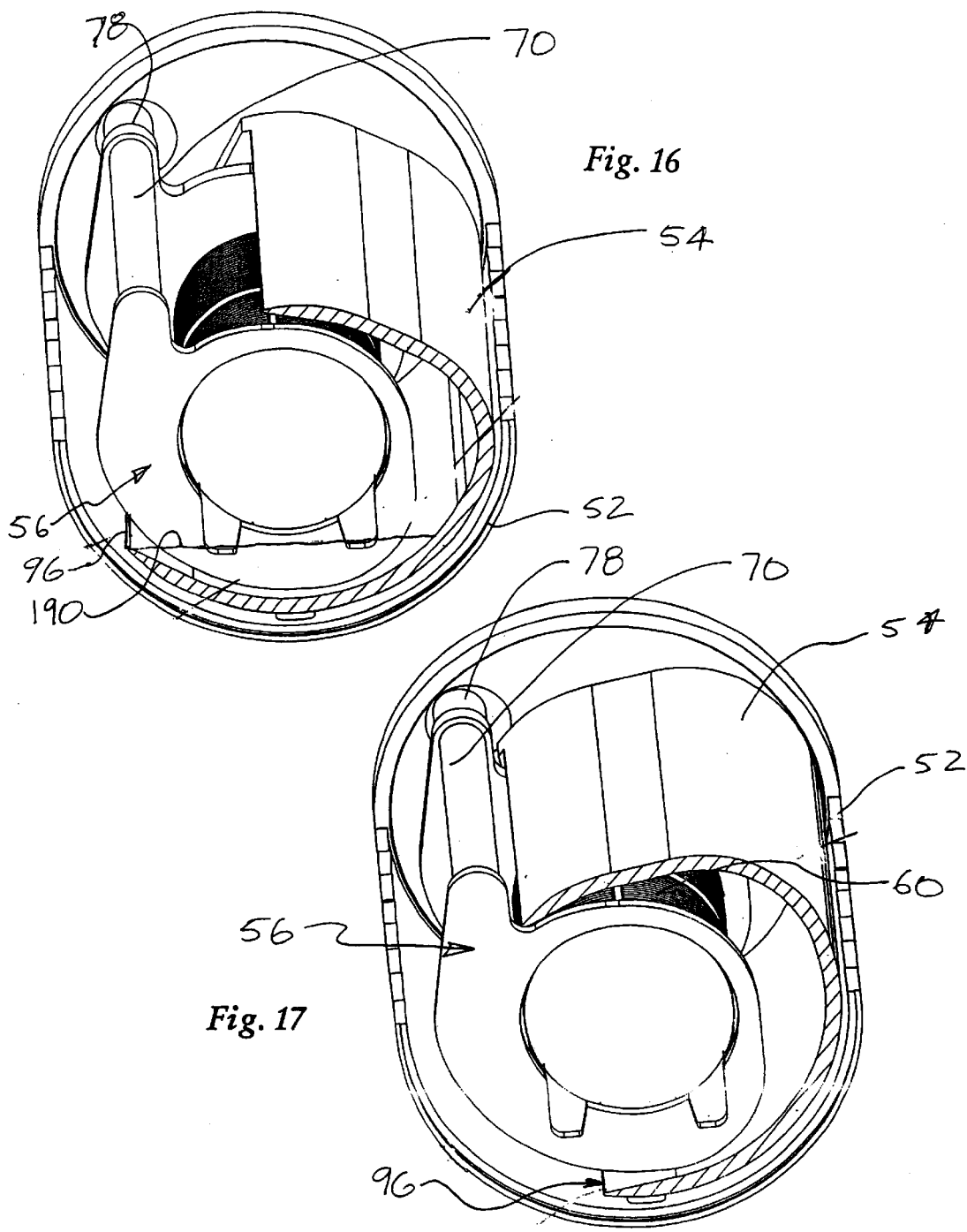
FIG. 16 is a perspective view thereof with the process chamber rotated about 60°.
FIG. 17 is a perspective view thereof with the process chamber rotated about 100°, to allow all liquid to flow out.

FIGS. 14–17 show the chamber 54 pivoted into four different positions, with FIG. 14 showing the starting position, and FIG. 17 showing the ending position, wherein all of the liquid has been removed. The movement of the chamber 54 from the position shown in FIG. 14 to the position shown in FIG. 17 is preferably smooth and continuous.

After all of the liquid has been removed by allowing the liquid to run out over the drain edge 96, the work pieces 60 may be removed from the processor unit 50. This is achieved by reversing the engagement sequence of the door assembly 138. Alternatively, the workpieces 60 may remain within the processor unit 50, and chamber 54 may be returned to its original 0° position, as shown in FIG. 14, to repeat the rinsing, spraying or immersion processing, one or more times.

In an alternative process for cleaning the workpieces, the sequence described above is followed. In addition, a vapor of an organic solvent, such as isopropyl alcohol, is introduced into the chamber 54, via nozzles or openings in the upper manifold 82. A gas, such as heated nitrogen, may also be provided, with the organic solvent vapor entrained in the gas, and introduced above the water level 190 in the chamber 54. The chamber 54 is pivoted or rotated, as described above. Water drains out over the drain edge 96. While this occurs, additional organic solvent vapor and gas is supplied into the chamber. The organic solvent vapor reduces the surface tension of the water at the workpiece surface/water interface. This reduces or prevents water droplets from remaining on the workpiece surfaces, as the water level drops, resulting in less contamination. The gas may be provided from a drying gas manifold 110 alongside of the vapor manifold 82, or it may be provided from the vapor manifold, with or without the vapor. After vapor supply is stopped, the drying gas preferably continues, to remove any remaining vapor from the chamber 54.

The outer chamber 52 contains and drains away liquid running over the drain edge 96, or leaking past the seal 106. The outer chamber also helps to isolate the workpieces from the ambient environment, human operators, adjacent parts and equipment. Where an outer chamber 54 is used, it can be purged with a gas or vapor to maintain a desired environment. The gas may be, for example, nitrogen, argon, ozone or a vapor such as HF, or a combination of them. However, the invention may be practiced as described above without any outer chamber. While deionized water is preferred as a rinsing liquid, other liquids or mixtures including hydrofluoric acid (HF) may also be used.

For sequential processing steps, different liquid, gas or vapor (collectively referred to here as "fluids") media may be applied to the workpieces by immersion, spraying, or other application. Cleaning, as described above, may be performed in between the processing steps. The manifolds described above may also be used to introduce other process fluids. Alternatively, additional manifolds may be provided for this purpose.

Especially where an outer chamber 52 is used, this sequential processing allows A the workpieces to remain fixed in place, at all times, preferably enclosed within the outer chamber 52, reducing the potential for contamination. Where the workpieces are immersed, a continuously refreshed bath of liquid may be provided into the chamber 54. In this application, the liquid may be pumped in via the lower manifold 80 and continuously drain out over the drain edge 96, with the chamber 54 remaining in the 0° or upright position shown in FIG. 14.

Sonic energy may be applied to the work pieces 60 via a transducer 112, preferably positioned on the work piece support 56. The transducer 112, such as a megasonic or ultrasonic transducer, is positioned to transmit sonic energy through liquid in the chamber 54, to the work pieces immersed in the liquid.

As shown in FIGS. 14–19, the work piece support 56 is supported on the arm 70 which is offset from the work pieces 60 as well as from the axis of rotation or axle 98 of the chamber 54. As shown in FIGS. 18 and 19, this allows the chamber 54 to pivot by about 100°, to drain all liquid from the chamber 54. All liquid, gas or vapor supply lines, as well as any electrical connections to any sensors, such as the liquid level sensor 88, are routed through the support arm 70 and attachment hub 78. This allows the chamber 54 to freely pivot around the work piece support 56 without interference, and without the need for special fittings or connections to accommodate movement.

FIG. 13 shows an alternative processor unit 200, similar to the processor unit 50 described above. However, the processor unit 200 shown in FIG. 13 is adapted to receive work pieces 60 held within a carrier, cassette, or tray 204. Accordingly, the processor unit 200 has an alternative work piece support 202 having a shelf 206 for holding a carrier 204, rather than the combs 76 as shown in FIG. 5. The design and operation of the processor unit 200 shown in FIG. 13 is otherwise similar to the design and operation of the processor unit 50 as described above.

Thus, while several embodiments have been shown and described, various changes and substitutions may of course be made, without departing from the spirit and scope of the invention. The invention, therefore, should not be limited, except by the following claims, and their equivalents.

What is claimed is:

1. A system of processing a workpiece, comprising:
    an enclosure;
    a process chamber having a drain opening;
    a workpiece holder within the process chamber and fixed in position relative to the enclosure;
    a process chamber driver linked to the process chamber, for pivoting the process chamber, to drain liquid out of the process chamber, at a controlled rate.

2. The system of claim 1 further including a sonic transducer on the workpiece holder.

3. The system of claim 1 further including a door engageable to the process chamber.

4. The system of claim 1 where the process chamber driver is linked to the process chamber with a magnetic coupling.

5. The system of claim 1 wherein the process chamber has a cylindrical side wall, and the drain opening is in the cylindrical sidewall.

6. The system of claim 1 wherein the process chamber is pivotable from a first position, where the process chamber can hold liquid at a level at least partially immersing a workpiece held in the workpiece holder, to a second position where liquid within the process chamber is able to drain out, through the opening, to a level entirely below the workpiece.

7. The system of claim 6 further comprising a fluid supply system including a fluid supply line extending into the process chamber.

8. The system of claim 7 further comprising at least one spray nozzle joined to the fluid supply line.

9. The system of claim 7 further comprising at least one of a process liquid source, a process gas source, and a process vapor source, connected into the fluid supply system.

10. The system of claim 1 where the workpiece holder includes combs having slots for holding workpieces.

11. The system of claim 10 where the workpiece holder is supported on a support arm offset from the center of the process chamber.

12. The system of claim 1 where the process chamber has cylindrical sidewalls and is pivotable about an axis parallel to the cylindrical sidewalls.

13. The system of claim 1 further comprising an outer chamber around the process chamber, with the workpiece holder fixed in position relative to the outer chamber.

14. A system for processing a workpiece, comprising;
    an outer chamber;
    a process chamber pivotably supported within the outer chamber;
    a drain opening in the process chamber;
    a process chamber driver for pivoting the process chamber; and
    a workpiece support within the process chamber, and with the workpiece support and the outer chamber fixed in position relative to each other.

15. The system of claim 14 where the drain opening comprises a slot through a cylindrical sidewall of the process chamber.

16. The system of claim 14 further including a door assembly having a first door engageable on the process chamber, and a second door engageable on the outer chamber.

17. The system of claim 14 where the process chamber and the outer chamber are cylindrical.

18. A method for processing a workpiece, comprising the steps of:
    placing the workpiece into a workpiece support;
    maintaining the workpiece in a stationary position;
    enclosing the workpiece support holding the workpiece within a process chamber;
    providing a process liquid into the process chamber; and
    pivoting the process chamber to allow process liquid to drain out.

19. The method of claim 18 where the workpiece is immersed in the process liquid.

20. The method of claim 18 further comprising the step of introducing a process gas or vapor into the process chamber.

21. The method of claim 18 further comprising the step of enclosing the process chamber within an outer chamber.

22. The method of claim 18 further comprising the step of pivoting the process chamber at a controlled rate to remove liquid from the process chamber at a controlled rate.

23. The method of claim 18 further comprising the step of providing sonic energy to the workpiece.

24. The method of claim 18 further comprising the step of closing off an open front end of the process chamber with a process chamber door.

25. The method of claim 18 further comprising the steps of introducing a rinsing liquid into the process chamber, and then introducing an organic vapor into the process chamber, to facilitate removal of the rinsing liquid from the workpiece.

26. A method for processing a workpiece, comprising the steps of:
    placing the workpiece into a workpiece support;
    enclosing the workpiece support holding the workpiece into a chamber;
    maintaining the workpiece support in a fixed position;
    pivoting the chamber about the workpiece support; and
    providing a process fluid into the chamber from at least one fluid supply opening on the first chamber.

* * * * *